United States Patent [19]

Pathuis et al.

[11] Patent Number: 4,733,407
[45] Date of Patent: Mar. 22, 1988

[54] CHARGE-COUPLED DEVICE

[75] Inventors: Jan W. Pathuis; Theodorus F. Smit, both of Nijmegen, Netherlands

[73] Assignee: U.S. Philips Corporation, New York, N.Y.

[21] Appl. No.: 931,374

[22] Filed: Nov. 14, 1986

[30] Foreign Application Priority Data

Nov. 14, 1985 [NL] Netherlands ................. 8503128

[51] Int. Cl.$^4$ ............... G11C 19/28; H03H 7/28; H01L 29/78
[52] U.S. Cl. ........................... 377/62; 377/61; 333/165; 357/24
[58] Field of Search ............... 333/165; 377/61, 62; 357/24

[56] References Cited

U.S. PATENT DOCUMENTS 4,493,060 1/1985 Varshney ..................... 365/238

OTHER PUBLICATIONS

Carfallo, Chung, Ghafghaichi, and Tzou, "Double Interlaced CCD with Buffered Transfer Gate", IBM Technical Disclosure Bulletin, vol. 25, No. 11B, Apr. 1983.

Primary Examiner—Eugene R. LaRoche
Assistant Examiner—Nathan W. McCutcheon
Attorney, Agent, or Firm—Thomas A. Briody; William J. Streeter; Gregory P. Gadson

[57] ABSTRACT

The invention relates to a charge-coupled device, in which the channel is provided with two or more separation regions for obtaining a desired charge subdivision, for example, for a transversal filter. Due to asymmetry in the potential distribution between the outer subchannels and the central subchannels, an inaccuracy occurs in the charge distribution, which according to the invention is eliminated for the major part by locally providing the separation channels bounding the outer subchannels with an interruption.

4 Claims, 5 Drawing Figures

CHARGE-COUPLED DEVICE

BACKGROUND OF THE INVENTION

The invention relates to a charge-coupled device comprising a charge transport channel, of which at least a part is provided with separation regions, by which this part of the channel is subdivided into n subchannels, by means of which a quantity of supplied charge Q is subdivided during transport through this part of the channel into n subcharges $Q_j$, where $j = 1 \ldots n$ and n an integer larger than 2.

The invention is of particular importance for filters, such as, for example, transversal filters, in which incoming signals are weighted, delayed and summed. In charge-coupled devices of the kind described above, the weighting factors associated with the different delay times are obtained by subdividing the incoming signal Q (t) into subsignals $Q_i$ (t), which are each transported through the charge-coupled device with an individual delay time.

Also for other circuits, the principle of charge distribution in the charge transport channel of the charge-coupled device can be used, as in situations in which a signal has to be subjected to different operations, where each component of the subdivided input signal can be used for one of the said operations.

A charge-coupled device of the kind described in the opening paragraph is known inter alia from the European Patent Application No. 040423 laid open to public inspection. It is suggested in this Application to obtain a given desired charge distribution via a binominal sequence, in which in a number of successive stages a charge packet is each time subdivided into two equal parts, one of which can be summed with a component or composite component of preceding distributions until the correct charge distribution is obtained. In this manner, an accurate distribution can be obtained, which is practically independent of process tolerances. A disadvantage of this method is that, in order to obtain given charge distributions, a large number of subdivisions and hence a charge-coupled device of great length and often also great width are required with all the inherent disadvantages with respect to, for example, space, dissipation and signal smearing due to transport losses.

SUMMARY OF THE INVENTION

The invention has for its object to provide a charge-coupled device of the kind described in the opening paragraph, in which an accurate charge distribution can be obtained in a comparatively small number of steps. The invention is based, inter alia, on the recognition of the fact that, when two charge packets with opposite errors are combined and are then subdivided again, a substantial reduction of the said errors can be obtained. The invention is further based on the recognition of the fact that subpackets with opposite errors are obtained, as will be explained hereinafter with reference to the description of the Figures, by asymmetry between the edge subchannels and the more centrally located subchannels, while the said asymmetry effects can be eliminated at least in part by locally interrupting the separation region between an edge subchannel and the adjacent subchannel.

A charge-coupled device according to the invention is characterized in that at least a subchannel located at the edge of the channel is separated from the adjacent subchannel by a separation region, which has an interruption, as a result of which the subcharges transported in these subchannels are combined again at the area of the interruption and are then subdivided again during the further transport into two subcharges.

Due to the fact that errors can be reduced in a simple manner, it is possible in a charge-coupled device according to the invention to obtain any desired charge distribution by means of only a small number of division stages.

An important preferred embodiment, by means of which a very accurate charge distribution can be obtained, is characterized in that the subchannels have equal widths so that the subcharges $Q_j$ have a relative ratio of practically 1:1:1 ... :1.

BRIEF DESCRIPTION OF THE DRAWINGS

The invention will now be described more fully with reference to an embodiment and the associated diagrammatic drawing, in which.

DETAILED DESCRIPTON OF THE INVENTION

Figure 1:
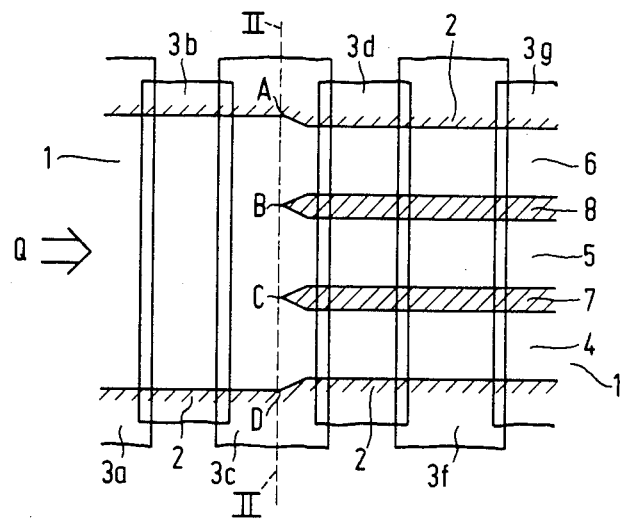
FIG. 1 is a plan view of a known charge-coupled device with charge subdivision.

In order to illustrate the effects that can occur with charge subdivision in a CCD and can adversely affect the accuracy, FIG. 1 shows in plan view a (part of a) CCD with a conventional charge subdivision.

The device, which may be both of the surface channel type (SCCD) and of the buried channel type (BCCD), comprises a channel 1, of which a part is shown in the plan view of FIG. 1. The lateral boundary of the channel is indicated by hatched lines 2. The charge Q is supplied on the lefthand side of the drawing and is transported to the right under the influence of suitable clock voltages, which are applied to the clock electrodes 3a, 3b, 3c etc. At the area of the line II—II, the channel 1 is subdivided into a number of subchannels 4, 5 and 6, for example three subchannels, as a result of which the signal Q can be subdivided into three subcharges $Q_1$, $Q_2$, $Q_3$, which are each equal to $\frac{1}{3}$ Q. For this purpose, the channel 1 is provided with two separation regions 7 and 8, which may be formed by thick oxide or by regions having a doping or doping-concentration different from that of the subchannels 4, 5 and 6. The separation regions are preferably of the same kind as the lateral boundary 2, but this is not necessary.

Figure 2:
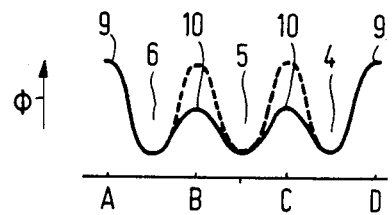
FIG. 2 shows the potential distribution taken along the line II—II in FIG. 1.

The charge distribution is mainly determined by the width of the subchannels 4, 5 and 6. When these subchannels have equal widths, the charge Q is conseqently subdivided into subpackets $Q_i$ of approximately $\frac{1}{3}$ Q. For an accurate charge subdivision, an accurate 1:1:1 ratio of the widths of the subchannels 4, 5 and 6 is required. It has been found that, even though this ratio can be made accurate and reproducible, nevertheless deviations may occur in the charge subdivision. In order to explain these deviations, FIG. 2 shows the potential diagram in the channel 1 taken on the line II—II in FIG. 1. The outer subchannels 4 and 6 are bounded at the points A and D on the outer side of the channel 1 by high potential barriers 9. On the side of the separation regions 7 and 8, the subchannels 4 and 6 are bounded by lower potential barriers 10, which are induced from the separation regions 7 and 8. The inner subchannel 5 sees at the beginning only the—lower—potential barriers 10. Further to the right in FIG. 1, the potential barriers 10 become increasingly higher and will reach the same height as the potential barriers 9 at the edge of the channel 1, as is indicated by broken lines in FIG. 2.

The situation for the three subchannels 4, 5 and 6 is then again quite symmetrical. However, at the beginning of the subdivision, the situation for the subchannel 5 is different from that for the edge channels 4 and 6. The situation for the subchannels 4 and 6 is indeed symmetrical. On account of these considerations, it can be expected that instead of the subpacket $\frac{1}{3}$ Q a subpacket $\frac{1}{3}$ Q$-\Delta$ is introduced into the subchannels 4 and 6, and a charge packet $\frac{1}{3}$ Q$+2\Delta$ is introduced into the central subchannel 5, $\Delta$ representing the average deviation.

Figure 3:
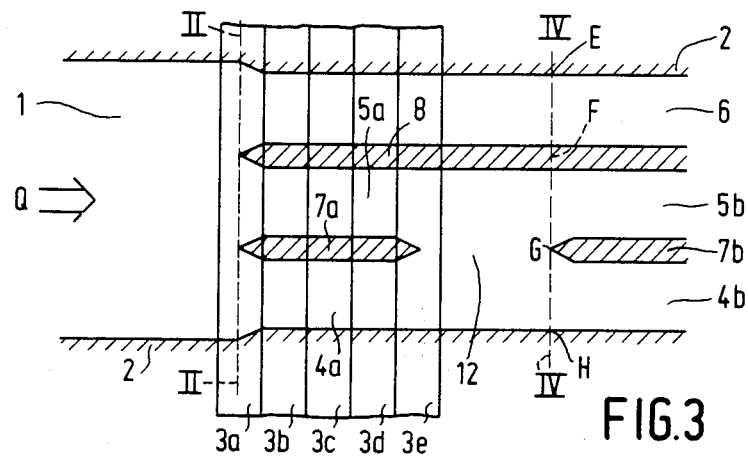
FIG. 3 is a plan view of a charge-coupled device according to the invention.

FIG. 3 shows in plan view a charge-coupled device according to the invention, in which this error is corrected, at least in part, in a very simple manner. For the sake of clarity, the device shown in FIG. 3 is provided for corresponding parts with the same reference numerals as the device shown in FIG. 1; the clock electrodes 3a, 3b, 3c etc. are represented in FIG. 3 only diagrammatically and in part, but should be assumed to be arranged as shown in FIG. 1 in the form of a two-layer wiring. As in the device shown in FIG. 1, the incoming charge packet should be subdivided, by way of example, into three subpackets, for which purpose the transport channel is subdivided by means of the separation regions 7 and 8 into three subchannels 4, 5 and 6 having equal widths. However, the separation region 7 now has an interruption 12, which subdivides the separation region 7 and the subchannels 4 and 5 into separation regions 7a and 7b and into subchannels 4a, 5a and 4b, 5b, respectively. The parts a and b are located before and behind the interruption 12, respectively.

At the area of the line II—II, the situation is identical to that at the area of the line II—II in FIG. 1. The incoming charge packet Q is subdivided into three charge packets, of which the packets in the outer subchannels 4a and 6 have a value of $\frac{1}{3}$ Q$-\Delta$, while the subpacket in the central channel 5a has a value of $\frac{1}{3}$ Q$+2\Delta$.

Figure 4:
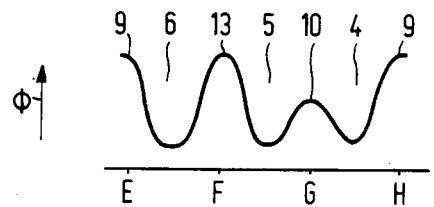
FIG. 4 shows the potential distribution in the device shown in FIG. 3 taken on the line IV—IV.

At the area of the interruption 12 in the separation region 7, the subpackets in the subchannels 4a and 5a are combined to a charge packet having a value of $\frac{2}{3}$ Q$+\Delta$. In FIG. 4, the potential distribution along the line IV—IV is shown, where the combined packet is subdivided again into two subpackets. The subchannel 6 is laterally bounded by the potential barrier 9 constituted by the lateral boundary 2 and by the potential barrier 13 constituted by the uninterrupted separation region 8. The subpacket having a value of $\frac{1}{3}$ Q$-\Delta$ introduced into this subchannel is transported further without being changed. The charge packet having a value $\frac{2}{3}$ Q$+\Delta$ combined at the area of the interruption 12 in the separation region 7 is subdivided again at the beginning of the region 7b into two subpackets. At the level of the line IV—IV at the point G, the potential barrier is still low, as shown in FIG. 4. The subchannels 4 and 5 are bounded on the outer side by a high potential barrier 9 constituted by the channel boundary 2 and by the high potential barrier 13, respectively, constituted by the uninterrupted separation region 8. Due to the fact that the potential distribution of the subchannels 4 and 5 is practically symmetrical and due to the fact that it is possible to make the ratio of the widths of the subchannels exactly equal to 1:1, the combined charge packet $\frac{2}{3}$ Q$+\Delta$ can be accurately subdivided into two equal parts. The subpackets introduced into the subchannels 4b and 5b then each have a value which is practically equal to $\frac{1}{3}$ Q$+\frac{1}{2}\Delta$. This means that, when simply an interruption is provided in the separation region 7, the error in the outer subchannel 4 can be reduced by half and can even be reduced to a quarter in the central subchannel 5, which results for many applications in a sufficiently high degree of accuracy.

In an analogous manner, the error in the subchannel 6 may also be reduced, if required, in the next stage of the charge-coupled device by providing an interruption in the separation region 8, as a result of which the corresponding subpackets having a value $\frac{1}{3}$ Q$-\Delta$ and $\frac{1}{3}$ Q$+\frac{1}{2}\Delta$ are first combined to form a charge packet having a value of $\frac{2}{3}$ Q$-\frac{1}{2}\Delta$, which is then subdivided again into two equally large subpackets having a value of $\frac{1}{3}$ Q$-\frac{1}{4}\Delta$.

The method described here may be repeated until the error has been reduced to an acceptable small value.

Figure 5:
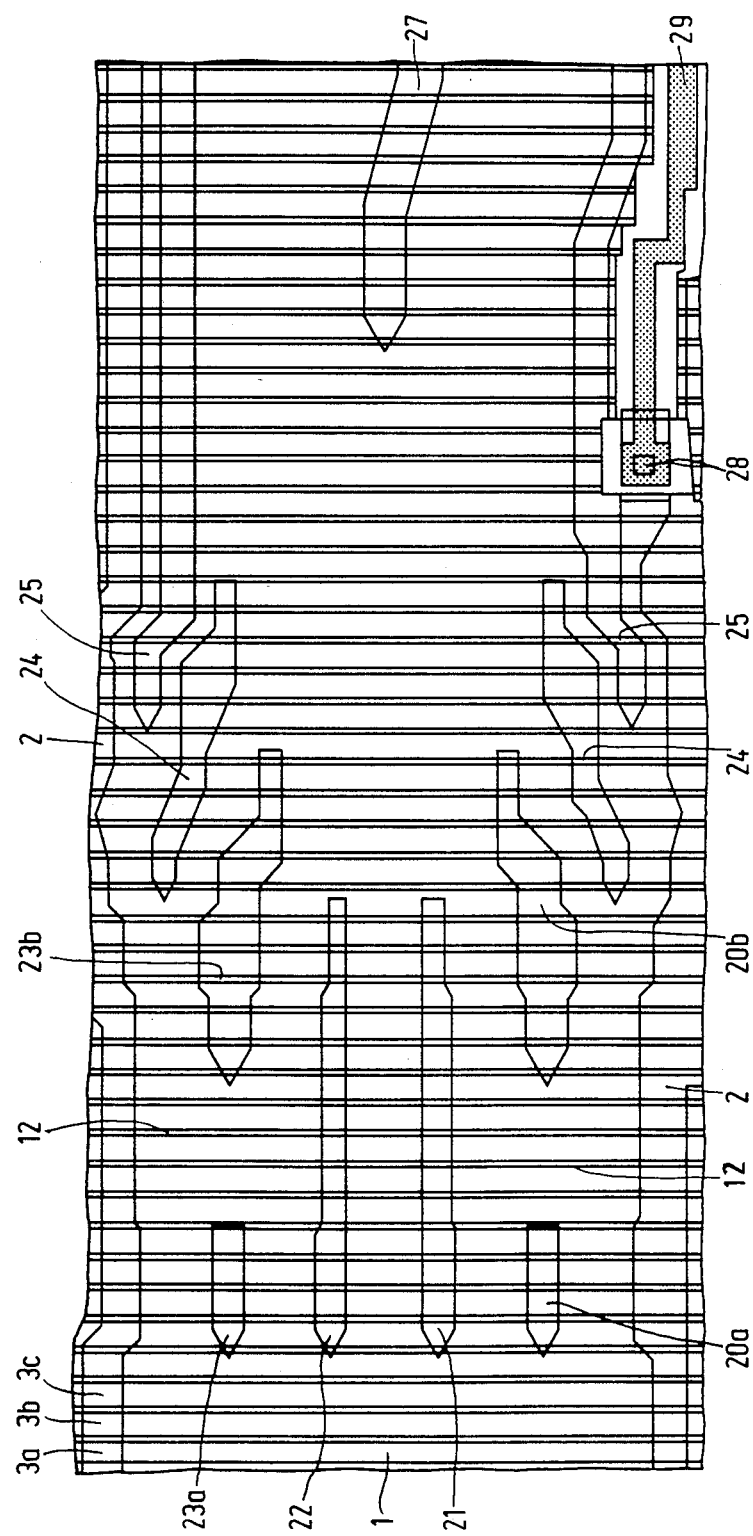
FIG. 5 is the plan view of a further embodiment of a CCD according to the invention.

FIG. 5 is a plan view of a transversal filter, in which the error-reduction method according to the invention described herein is used. The charge transport channel 1 is subdivided by the separation regions 20–23 into five subchannels of equal widths. The separation regions 20 and 23 each have an interruption, as a result of which the subpackets in the outer subchannels and the adjoining central subchannels are combined and subdivided again. An incoming signal having a value Q is subdivided by the separation regions 20a, 21, 22, 23a into five subpackets, of which the subpackets in the outer subchannels each have a value of 1/5 Q$-\Delta$ and the subpackets in the inner subchannels have a value of 1/5 Q$+\frac{2}{3}\Delta$. By means of the separation regions 20b and 23b, four subpackets of about 1/5 Q$-1/6$ $\Delta$ are formed. The error in the subpackets is now even reduced by a factor 6. The subpackets having a value 1/5 Q$-1/6$ $\Delta$ in the outer subchannels between the boundary regions 20b and 23b, respectively, and the lateral channel boundary 2 are subdivided into two parts by the separation regions 24 and 25 according to a binominal sequence, each time a part being added to the subpacket which is transported in the central part of the charge transport channel and is in turn again subdivided into two parts by the separation region 27. Reference numeral 28 denotes an output, at which the output signal with the smallest delay multiplied by the desired factor can be derived and can be supplied via a conductor 29 to a summing circuit to be added to the other output signals not shown.

The device can be manufactured by methods known per se, which need not be explained further herein.

It will be appreciated that the invention is not limited to the embodiments shown here, but that many further variations are possible for those skilled in the art. Besides in filters, the invention may also be used in CCD's for other applications, in which an accurate subdivision of introduced charge packets is required.

What is claimed is:

1. A charge-coupled device comprising a charge transport channel, of which at least a part is provided with separation regions, by which this part of the channel is subdivided into n subchannels, by means of which a quantity of supplied charge Q is subdivided during transport through this part of the channel into n subcharges $Q_j$, where $j=1\ldots n$ and n is integer and larger than 2, and at least a subchannel located at the edge of the channel which is separated from the adjacent subchannel by a separation region which has an interruption, as a result of which the subcharges transported in these subchannels are combined again at the area of the interruption and are then subdivided again into two subcharges during further transport.

2. A charge-coupled device as claimed in claim 1, wherein the subchannels have equal widths so that the subcharges $Q_j$ have a relative ratio of about 1:1:1 ... :1.

3. A filter comprising a charge-coupled device, said charge-coupled device comprising a charge transport channel, of which at least a part is provided with separation regions, by which this part of the channel is subdivided into n subchannels, by means of which a quantity of supplied charge Q is subdivided during transport through this part of the channel into n subcharges $Q_j$, where $j=1\ldots n$ and n is integer and larger than 2, and at least a subchannel located at the edge of the channel which is separated from the adjacent subchannel by a separation region which has an interruption, as a result of which the subcharges transported in these subchannels are combined again at the area of the interruption and are then subdivided again into two subcharges during further transport.

4. A filter comprising a charge-coupled device, said charge-coupled device comprising a charge transport channel, of which at least a part is provided with separation regions, by which this part of the channel is subdivided into n subchannels, by means of which a quantity of supplied charge Q is subdivided during transport through this part of the channel into n subcharges $Q_j$, where $j=1\ldots n$ and n is integer and larger than 2, and at least a subchannel located at the edge of the channel which is separated from the adjacent subchannel by a separation region which has an interruption, as a result of which the subcharges transported in these subchannels are combined again at the area of the interruption and are then subdivided again into two subcharges during further transport, wherein the subchannels have equal widths so that the subcharges $Q_j$ have a relative ratio of about 1:1:1 ... :1.

* * * * *